United States Patent [19]

Daniels et al.

[11] Patent Number: 4,680,897
[45] Date of Patent: Jul. 21, 1987

[54] METHOD FOR MACHINING HOLES IN COMPOSITE MATERIALS

[75] Inventors: Julia G. Daniels, Madison; Frank E. Ledbetter, III, Huntsville; Johnny M. Clemons, Trinity; Benjamin G. Penn; William T. White, both of Huntsville, Ala.

[73] Assignee: The United States of America as represented by the Administrator of the National Aeronautics and Space Administration, Washington, D.C.

[21] Appl. No.: 804,039

[22] Filed: Dec. 3, 1985

[51] Int. Cl.<sup>4</sup> .......................... B24C 1/08; B23B 35/00
[52] U.S. Cl. .................................... 51/281 R; 408/1 R
[58] Field of Search ...................... 29/557; 408/1, 144, 408/145, 59, 60; 51/281 R, 328, 292, 323

[56] References Cited

U.S. PATENT DOCUMENTS

| 2,272,271 | 2/1942 | Mallory | 408/1 |
| 2,478,846 | 8/1949 | Smith | 408/59 |
| 3,074,392 | 1/1963 | Fisher | 408/1 |
| 3,699,719 | 10/1972 | Rozdilsky | 51/328 |
| 4,519,732 | 5/1985 | Sutcliffe | 408/1 R |

FOREIGN PATENT DOCUMENTS

| 41885 | 4/1978 | Japan | 408/144 |
| 3180 | 1/1981 | Japan | 51/281 R |

*Primary Examiner*—William R. Briggs
*Attorney, Agent, or Firm*—Joseph H. Beumer; John R. Manning; Leon D. Wofford, Jr.

[57] ABSTRACT

A method for boring well-defined holes in a composite material such as graphite/epoxy. A slurry of silicon carbide powder and water is projected onto a work area of the composite material in which a hole is to be bored with a conventional drill bit. The silicon carbide powder and water slurry allow the drill bit, while experiencing only normal wear, to bore smooth, cylindrical holes in the composite material.

5 Claims, 2 Drawing Figures

METHOD FOR MACHINING HOLES IN COMPOSITE MATERIALS

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The invention relates to the machining and drilling of holes in composite materials mainly of the class characterized by being filament or fiber reinforced plastics. These composite materials are finding wide application in aircraft industries and in space programs of the National Aeronautics and Space Administraction. However, continued use of composite materials requires routine experimental investigation to determine specimen properties such as mechanical, strength, elastic, etc. Most important of the properties is the in-plane shear strength which is a property of composite materials such as graphite/epoxy which needs to be routinely determined.

Shear tests typically require drilling of holes in the composite materials. Due to the nature of composite materials, the problem occurs routinely that damage to the drill bits as well as to the materials occur during the boring of holes in the materials which are required for performing the above tests. Typically, a conventional drill press is utilized to drill these bores in the material. Even when silicon carbide or low-carbon steel drill bits are utilized, the damage to the drill bits still occurs. No conventional drill bits have been found on the market which can stand the rigors of routine drilling of the holes in the composite materials heretofore described without damaging the bit. In testing the composite materials for the above noted properties, a test commonly referred to as the "three-rail shear test" is commonly employed. This test is discussed in *Composite Material Design Guide,* University of Delaware, Vol. 1, Newark, Del. (1983), and in *Experimental Mechanics of Fiber Reinforced Composite Materials,* by J. M. Whitney, et al., Prentiss-Hall, Brookfield, Conn., Pg, 160 (1982). In performing the three-rail shear test, nine holes of 178 inch diameter are drilled through the thickness of a board of composite material. The thickness of the board depends on the nature of the particular composite material. For the above referred to graphite/epoxy composite material, a board of 0.06 inches is utilized. During preparation of the sample board, considerable trouble may be encountered in attempting to bore the nine holes with conventional drill bits such as described above. Various combinations of tool speed and pressures may be used, however, even when using water cooling, the end result is usually an unusable hole.

Accordingly, an object of the present invention is to provide a method for drilling test holes in a board of composite material during a three-rail shear test without damaging the drill tool or the material specimen.

Another object of the present invention is to provide a method for machining a hole in a composite material of the fiber-reinforced plastic type without damaging the drill tool or the material.

Still another object of the invention is to provide a method for drilling or machining a uniform regular bore in a test specimen of composite fiber-reinforced plastic material so that accurate testing of the material for shear strength may be had.

SUMMARY OF THE INVENTION

It has been found that the above objectives can be accomplished according to the present invention by adding a liquid slurry mixture of water and silicon carbide powder to the composite material board at the location where the board is to be drilled or machined. It has been found that using a water slurry of silicon carbide powder directed on the composite board being tested results in a test operation that proceeds smoothly and efficiently. Normal wear is encountered by the tool bits, whereas in the past the edges of the drill fluting and sides of the drill would become pitted and chipped. A bore having a smooth, well-defined interior surface is formed in the test material having an accurate and uniform diameter, whereas in the past only a jagged, non-uniform opening was formed in the material. The holes are bored rapidly through the boards whose thicknesses range from 0.04 inches to 0.06 inches and whose ply orientations range from unidirectional, quasi-isotropic symmetrical, and cross-ply.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
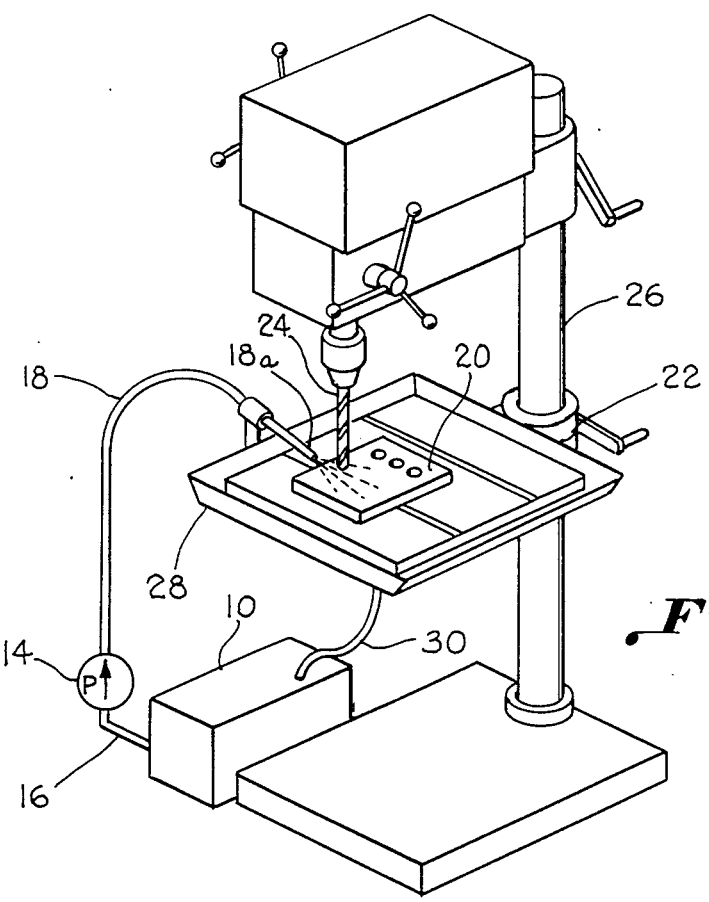
FIG. 1 is a schematic illustration illustrating the method of the present invention for drilling and machining bores in a fiber-reinforced composite material specimen.

Referring now in more detail to FIG. 1, a reservoir 10 is illustrated for containing a water slurry of silicon carbide or other suitable material which may be used with the method of the invention. It is believed that other materials such as tungsten carbide or silicon nitride may also be used with the method of the invention. The reservoir 10 contains a water slurry of silicon carbide wherein the slurry silicon carbide powder effectively consists of about 30 to 60 percent of the weight of the water slurry. It has been found that percentages of silicon carbide powder outside this range are not effective.

A pump 14 is connected to the reservoir 10 by means of a conduit 16. A conduit 18 connects the pump to an area disposed above the specimen board 20 of composite material, such as graphite/expoxy being drilled or machined. The specimen board 20 being machined is supported on a support platform 22 of a conventional rotating boring tool such as a drill bit 24 carried by a drill press 26. Beneath the support board 22 is a collection reservoir 28 for collecting the water slurry as it turns off of the specimen board 20. The conduit 18 may be a suitable length of copper piping or other suitable material having an outlet 18a which is disposed above and in close proximity to the specimen board 20. By directing the water slurry directly onto the face of the specimen board 20, it has been found in accordance with the present invention that the drilling or machining of regular three-rail shear test holes 32 illustrated in FIG. 2 may be done in a uniform and efficient manner. The water slurry provides a cutting medium for drill bit 24 which allows drill bit 24 to produce well-defined cylindrical holes in specimen board 20. No tearing of the material within the hole or pitting and chipping of the fluting of the drill bit occurs. The water slurry is recirculated after being collected in collection reservoir 28 via a conduit 30 leading back to reservoir 10.

Figure 2:
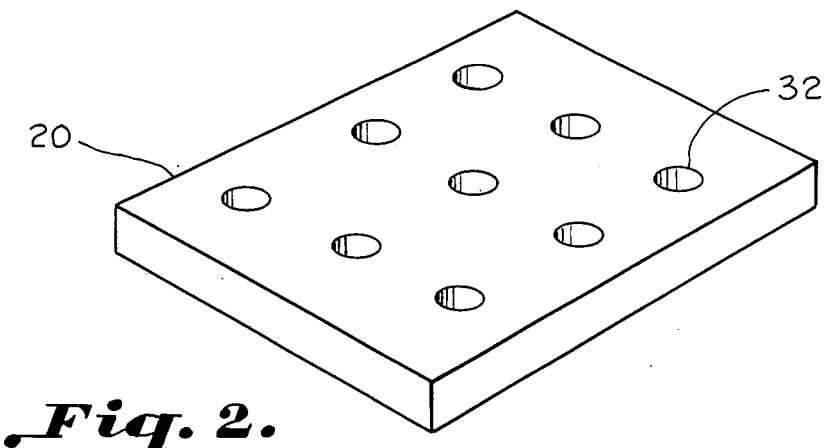
FIG. 2 is an illustration of the layout for conducting a three-rail shear test for testing the properties of a composite material specimen in a conventional manner.

FIG. 2 shows a pattern for drilling the test holes in a composite specimen board according to the dimensions illustrated for the three-rail shear test specimen referred to above. No damange was done to the drilling tools during the curring operation except for possible loss of the cutting edge. However, it has been found that dull tools bore as fast, or even faster, than sharp ones. From observation of this phenomena, it was concluded that silicon carbide powder was actually boring the holes by resulting action of the particles being trapped between the surfaces of the cutting tool and the surface of the composite material. It is to be understood, of course, that the process of the invention may be used for other reasons when it becomes necessary to drill holes in composite materials.

Oils and other lubricants may not be used with the composite material to which the instant invention is directed because the oils tend to plasticize the polymer matrix of the composite material.

While a preferred embodiment of the invention has been described using specific terms, such description is for illustrative purposes only, and it is to be understood that changes and variations may be made without departing from the spirit or scope of the following claims.

What is claimed is:

1. A method for machining a hole in a composite material of the type having fiber reinforcement, comprising:
   providing a rotating boring tool for rotationally machining the hole in a work surface of the composite material;
   fixedly supporting the composite material for receipt of said rotating boring tool in said work surface;
   applying a liquid slurry mixture of water and between thirty and sixty present silicon carbide powder to said work surface of the composite material;
   machining the hole in said work surface on said composite material with said rotating boring tool while applying said liquid slurry mixture to said work surface; said liquid slurry mixture being allowed to become interposed between said rotating boring tool and the composite material as the hole is being machined, so that said liquid slurry mixture acts as a cutting medium for enabling said rotary boring tool to provide the hole with a well-defined, substantially cylindrical interior surface.

2. A method for machining a hole in a composite material, having fiber reinforcement comprising:
   machining the hole in the composite material with a rotating boring tool while simultaneously applying a liquid slurry mixture of water and between thirty and sixty percent silicon carbide powder to the hole being machined; said liquid slurry mixture becoming interposed between said rotating boring tool and the hole for acting as a cutting medium.

3. A method for machining a hole in a composite material as set forth in claim 1 or 2, further comprising:
   continuously recirculating said liquid slurry mixture during machining for continuous application of said liquid slurry mixture to the hole being machine.

4. The method of claim 2 wherein said composite material is a fiber reinforced plastic composite material.

5. In a method for shear testing a fiber reinforced composite plastic material of the type wherein holes are drilled into said material according to a prescribed pattern in a work area of said material, wherein the improvement comprises introducing a water slurry of about 30 to 60 percent silicon carbide powder to the work area while said holes are being drilled by a rotating tool to prevent tearing of said material providing uniform holes for effective reliable shear testing.

* * * * *